United States Patent [19]

Gurol

[11] Patent Number: 4,861,640
[45] Date of Patent: Aug. 29, 1989

[54] MOLDED CIRCUIT BOARD AND MANUFACTURING METHOD THEREFOR

[75] Inventor: Ismail M. Gurol, Stafford, Pa.

[73] Assignee: John Fluke Mfg. Co., Inc., Everett, Wash.

[21] Appl. No.: 153,565

[22] Filed: Feb. 3, 1988

Related U.S. Application Data

[60] Continuation-in-part of Ser. No. 804,464, Dec. 4, 1985, abandoned, which is a division of Ser. No. 414,954, Sep. 3, 1982, Pat. No. 4,604,799.

[51] Int. Cl.[4] ............................................. B32B 3/00
[52] U.S. Cl. ..................................... 428/137; 428/209;
428/409; 428/901; 427/96; 264/104; 264/260;
29/847; 29/852; 174/68.5
[58] Field of Search ................. 264/104, 260; 427/96,
427/97; 428/137, 209, 901, 409; 29/847, 852;
174/68.5

[56] References Cited

U.S. PATENT DOCUMENTS

| | | |
|---|---|---|
| 3,042,591 | 7/1962 | Cado . |
| 3,466,360 | 9/1969 | Chipman . |
| 3,889,363 | 6/1975 | Davis .................... 264/104 |
| 4,022,928 | 5/1977 | Pincyzk .................. 430/945 |
| 4,080,513 | 3/1978 | Cuneo et al. ............. 174/68.5 |
| 4,339,303 | 7/1982 | Frisch et al. ............ 156/629 |
| 4,403,107 | 9/1983 | Hoffman ................. 174/68.5 |
| 4,424,095 | 1/1984 | Frisch et al. ............ 156/629 |
| 4,520,067 | 5/1985 | Harris et al. ............ 428/323 |
| 4,532,152 | 7/1985 | Elarde ................... 427/96 |
| 4,604,799 | 8/1986 | Gurol .................... 427/96 |

FOREIGN PATENT DOCUMENTS 2394228 3/1983 France .

Primary Examiner—Ellis P. Robinson
Assistant Examiner—P. J. Ryan
Attorney, Agent, or Firm—Benjamin J. Hauptman; Stephen A. Becker; Mikio Ishimaru

[57] ABSTRACT

A molded circuit board is formed with a nonconductive molded polymer substrate base having at least one channel in a surface thereof. A sputtered conductive film is disposed in the channel on a virgin polymer surface thereof to establish a circuit line in the channel.

14 Claims, 3 Drawing Sheets

FIG. 1
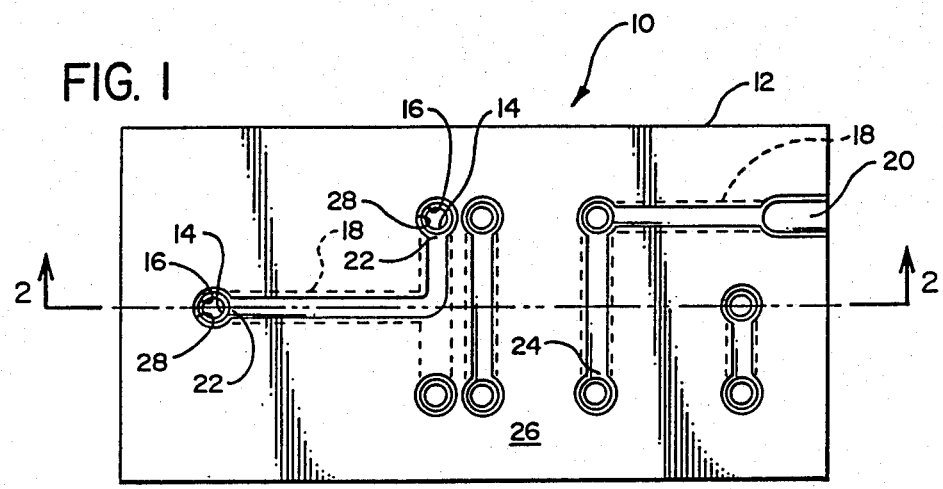
FIG. 2
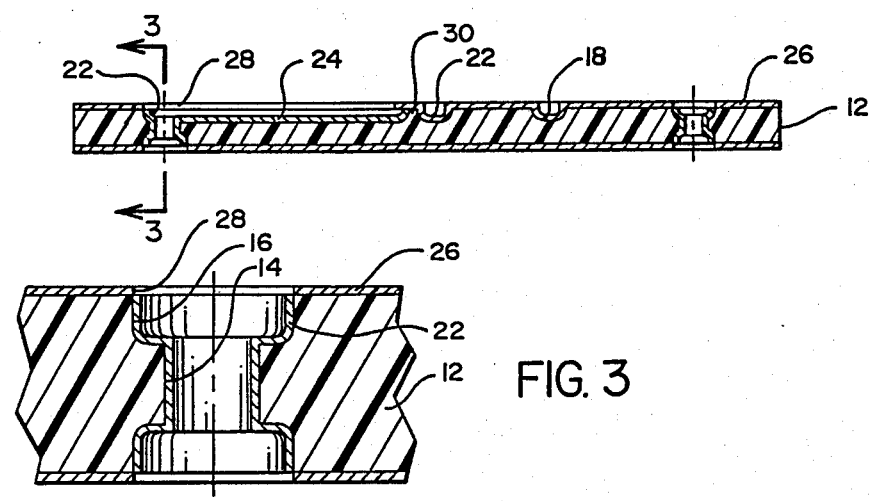
FIG. 3
FIG. 4A
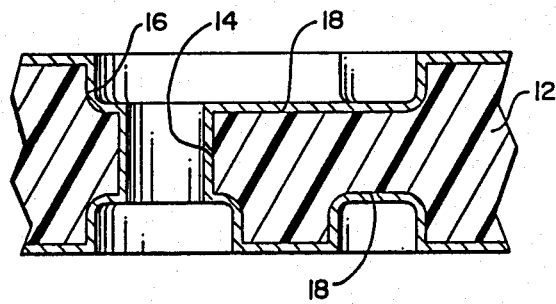

MOLDED CIRCUIT BOARD AND MANUFACTURING METHOD THEREFOR

The present application is a continuation-in-part application of U.S. patent application Ser. No. 804,464 filed Dec. 4, 1985 now abandoned which is a divisional application of U.S. patent application Ser. No. 414,954, filed Sept. 3, 1982, now U.S. Pat. No. 4,604,799, issued Aug. 12, 1986.

FIELD OF THE INVENTION

The present invention relates generally to printed circuit boards and particularly to a nonprinted, channeled circuit board.

BACKGROUND OF THE INVENTION

In the past, when the printed circuit board was first developed, it was hailed as a major advance in electronics technology over hard wired boards in that it permitted more components to be mounted in smaller areas. As the printed circuit board technology evolved, many complex chemical processing techniques developed for improving the number and configuration of circuit lines which could be placed on a circuit board.

Since "printed" circuit board technology involves photographic processes, many different chemical baths are required which means expenses in processing and for the processing equipment. Over 55 different steps are required to make a single printed circuit board. In addition, the need for different chemical steps has resulted in serious problems with chemical waste control both in the vapors and residues of the various processes.

Heretofore, almost all developments in printed circuit board technology have been directed towards improved chemical processes and improved printing techniques. These refinements of technology are rapidly reaching the point of minimal return.

Further, there have been major problems with making connections from the circuit lines on one side of the circuit board to the other and of making adequate connections of components to the boards. This has resulted in a search for a method of making improved conductive connections via the through-holes provided in the board for component mounting.

Originally, the distances between circuit lines were relatively wide and in 1965 the state of the art was approximately 12 mils. By 1980 they were down to 6 mils and current projections are that the maximum theoretical limit using known printed circuit technology is about 2 mils with 0.25 mil thick copper laminations.

Closer line placements are required and this requirement has increased the demand for better insulation between lines as well as better immunity to airborne and chemical processing contaminants. Not only has the progress of printed circuit technology consistantly challenged the plating industry for innovations, but also for economy in the face of rising raw material and energy prices. Further, a greater sense of awareness of environmental protection requirements and for health and safety in the work place have posed tremendous challenges for the industry.

With the new requirements posed and the the new problems, there has been a long felt need for major innovation with respect to processes and equipment in circuit board technology.

SUMMARY OF THE INVENTION

The present invention provides a quantum jump in circuit board technology which is as innovative as the original development of the printed circuit board. The invention further provides a method for manufacturing a circuit board which does not require printing and which, while usable in conjunction with various conventional chemical printing processes, may be manufactured totally without the use of chemicals.

The present invention provides a circuit board in which improved, uniform thickness connections are made from the circuit lines on one side of the board to the other and provisions are made for providing adequate mechanical support and conductive connection for components.

The present invention provides a circuit board with circuit lines which can be closely controlled in thickness by a two step plating process which nonchemically plates a uniform thin layer by a process such as sputtering (which does not cause excessive buildup in corners or edges) followed by chemical plating which allows the thin layer to be accurately thickened.

The present invention provides for a reduction in the number of steps required in manufacturing a circuit board from around 55 to 3; i.e. forming, plating, and surface machining.

The present invention provides a circuit board and manufacturing process which requires a minimal expenditure in raw materials and energy, and further in which all the waste material is recyclable.

The present invention provides a new circuit board and manufacturing process therefore which substantially reduces the cost of circuit boards.

The present invention provides a circuit board and manufacturing process which does not utilize, or utilizes a minimum of, chemicals and thus is not subject to the environmental waste problems attendent upon conventional printed circuit board technology.

The present invention allows for a closer than conventional line spacing by virtue of the circuit lines being recessed into the board material which is a better insulator than the air which the insulator for conventional circuit boards.

The present invention provides for fewer defective boards because the surface machining of the present invention removes a small part of the surface of the board leaving virgin material as the insulator between circuit lines, thus the surface particles and chemical contaminents which provide conductive paths to cause circuit board failures are removed.

The present invention further provides a circuit board and manufacturing process which utilize conventional technolgy without the need for chemical or photographic techniques.

In accordance with one aspect of the invention, a circuit is formed by the process of forming a thermoplastic polymer substrate molded with at least one channel board or carrier is formed from a thermoplastic polymer substrate molded with at least one channel. A conductive material, such as copper, is sputtered to a uniform thin layer covering the channel and remaining non-channel portions. Thereafter, the conductive material layer on the non-channel portions is removed by surface machining down to the virgin polymer material.

In another aspect of the invention, the conductive material is sputtered directly onto the virgin polymer surface of the board substrate without prior chemical treatment of the substrate. During sputtering, the polymer substrate board is placed in a large demountable vacuum tube having a cathode made of the metal to be sputtered. The tube is operating under conditions that promote cathode bombardment by positive ions. As a result, extremely small particles of molten material fall uniformly on the object at high velocity to produce on it a thin, conductive metal coating.

The sputtering process preferably occurs in an argon atmosphere. To improve adhesion of the conductive material on the virgin polymer substrate, small quantities of oxygen are initially introduced into the argon atmosphere at the beginning of the sputtering process. This oxygen chemically reacts with the conductive material to partially oxide the conductive material to obtain an initial oxide layer on the virgin polymer substrate which improves adhesion. Preferably, the oxygen is only used at the beginning of the sputtering process.

In one embodiment of the invention, the oxygen is supplied at a partial pressure of approximately $20 \times 10^{-5}$ mm of mercury for about 1/10 of a second and concurrent with sputtering of the copper conductive material. Thereafter, the supply of oxygen terminates and pure copper is then sputtered onto the oxide layer for approximately 40 to 50 seconds to obtain a copper thickness of about 4 to 5 micrometers.

In accordance with a further aspect of the invention, the sputtered board is then subjected to heat treatment for approximately 12 to 25 minutes at a temperature of about 175°–225° C., and preferably 200° C. for 20 minutes. It has been discovered that the heat treatment significantly improves the adhesion of the sputtered copper film to the virgin polymer substrate surface.

The sputtering of conductive metal such as copper to coat the polymer substrate is a preferred form of vacuum deposition since the molten conductive metal particles bombard against the polymer substrate at high speed to uniformly adhere to the surface by compaction. The metal matrix of the sputtered material is substantially free of chemicals and is therefore substantially corrosion resistant in relation to plated conductive material.

Surface treatment method for oxidizing the substrate surface may also include acid etching, oxygen plasma, etc.

It will be apparent to those skilled in the art that the present invention can be practiced on circuit boards in which circuit lines are formed on one or both sides of the circuit board and further in which the components are surface mounted on the board. Thus, the present invention applies to channeled circuit boards formed without through-holes and recesses.

The above and additional advantages of the present invention will become apparent to those skilled in the art from a reading of the following detailed description when taken in conjunction with the accompanying drawings.

BRIEF DESCRIPTION OF THE DRAWINGS

FIG. 1 is a top view of a circuit board manufactured in accordance with the present invention;

FIG. 2 is a cross-sectional view taken along line 2—2 of FIG. 1;

FIG. 3 is an enlarged, partial cross-sectional view, out of scale, of a through-hole taken along line 3—3 of FIG. 2;

FIG. 4A is an enlarged, partial cross-sectional view, out of scale, of a portion of an embodiment of the present invention during its manufacturing process;

DESCRIPTION OF THE PREFERRED EMBODIMENTS

Figure 4B:
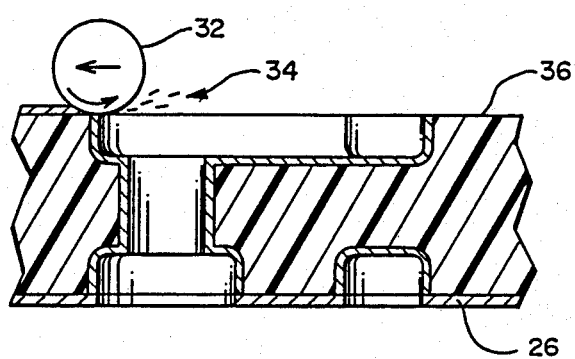
FIG. 4B is an enlarged, partial cross-sectional view, out of scale, of the present invention shown in FIG. 4A during another manufacturing steps.

Referring now to FIGS. 1 and 2, therein are shown a "basic" channeled circuit board 10. The circuit board 10 is made of a formed polymer board or nonconductive base 12 having through-holes 14 surrounded by formed recesses 16 which are connected by formed, depressed, channels 18. The channels 18 are shown with rectangular cross-sections for illustrative purposes; any configuration channel would be satisfactory. The board is generally between 10 to 60 mils thick and the channels 18 between 1 to 10 mils deep. The edge connector depression pad 20 is merely a broadened extension of a channel 18. The through-holes 14, recesses 16, channels 18, and pad 20 are all covered by a conductive material 22, such as copper, to form circuit lines 24. The circuit lines 24 on top and bottom, as best seen in FIG. 2, are connected by the copper 22 in the through-holes 14 and recesses 16.

To protect the circuit board 10 from airborne contaminants which may cause shorting between the circuit lines 24, the nonconductive base 12 is covered by a protective, solder repellent, chemically inert material or solder mask 26 having holes 28 (exaggerated in size in FIG. 1) which encircle the recesses 16 to allow for selective deposition of solder as will later be described. The solder mask 26 completely covers and contacts the nonconductive base 12 and the circuit lines 24 except for the holes 14 and recesses 16.

As may be seen in FIG. 2, the channels 18 are depressed into the nonconductive base 12 such that two parallel circuit lines 24 are separated by virgin polymer 30. The base 12 may be a thermoplastic such as polysulfone, polyethersulfone, polyetherimide, polyether-etherkefone, etc., or a thermoset material such as dialylphthalate, epoxy, polyester, phenolics, etc.

Since the polymer 30 is selected to be an excellent insulator, much better than air, it is possible to put circuit lines 24 physically closer together than would be possible with conventional printed circuit techniques since these leave the circuit lines above the surface of the base and insulated only by air. Further, the solder mask 22 keeps any contaminants from the polymer 30 and so prevents the future possibility of short circuits.

Referring now to FIG. 3, therein is shown an enlarged, partial cross-sectional view, out of scale, of the through-hole 14 of FIG. 2 taken along line 3—3 which shows the base 10 the conductive material 22 and the solder mask 26.

Figure 5:
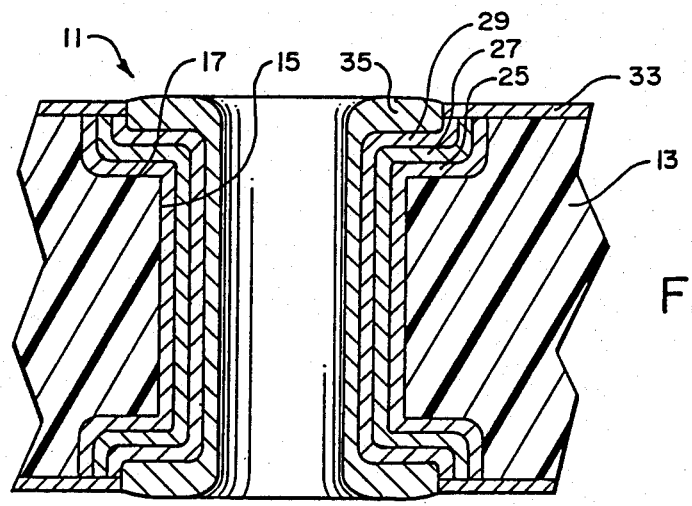
FIG. 5 is an enlarged, partial cross-sectional view, out of scale, of a through-hole similar to FIG. 3 of an alternate embodiment of the present invention.

While the conductive material 22 of the circuit lines 24, the recesses 16 and the through-holes 14 may be of a single conductive material as with the basic channeled circuit board 10, in a P"production" channeled circuit board 11 having a nonconductive base 13 with through-holes 15, formed recesses 17, formed channels 18, and pads 20, the conductive material 23 is made up of a number of different materials as shown in FIG. 5 which is a cross-sectional view similar to FIG. 3.

As shown in FIG. 5, the formed polymer board or nonconductive base 13 is covered with a chromium plating 25, generally sputtered, covered by a copper plating 27, generally also sputtered. The chromium plating 25 being a reactive metal acts as an adhesive to bond the copper plating 27 to the base 13. Palladium is an example of another reactive metal which could be used.

In many applications, larger cross-sectional areas of copper, are required than can be quickly applied by sputtering. In those cases, an electrochemical copper plating 29 covers the sputtered copper plating 17.

The conductive material in the circuit lines 31 and the base 13 are covered by a solder repellent mask 33 and a solder such as bright tin plating 35 is then plated on top of the copper plating 29 in recess 17 and the through-hole 15 which are not covered by the solder mask 33.

Referring now to FIGS. 4A and 4B, therein are shown the manufacturing operations for manufacturing a basic channeled circuit board 10. The base 12 is first formed with the channels 18, through-holes 14, and recesses 16 in both surfaces by conventional forming techniques such as injection, compression, or transfer molding, or even stamping. Although the channels 18, through-holes 14 and recesses 16 are provided in the preferred embodiment by being formed when the base 12 is formed, they could also be provided by the expedients such as laser machining or routing and drilling.

While not shown, the base 12 is washed to remove debris from the forming operation and then clamped flat and baked to planarize the boards and stress relieve. The clamping pressure and the baking temperature are dependent upon the exact composition and configuration of the boards and may have to be determined heuristically as would be evident to those skilled in the art.

After planarizing and stress relieving, the base 12 is then coated with the conductive material 22 as shown in FIG. 4A. Generally the coating is copper and the plating application methods are conventional ion plating, evaporation deposition, or sputtering. In the preferred embodiment, sputter plating is utilized for depositing copper.

The basic channeled circuit board 10 is then surface machined by any of a number of conventional processes which include sanding, planing, milling, fly cutting, or grinding to remove the sputtered copper 22. As shown in FIG. 4B, when grinding with a grinding wheel 32, particles 34 of copper and polymer will be removed to form a copper-free surface 36 which will be the virgin polymer material of the base 12.

The particles 34 of copper and polymer may be easily recycled by melting out the polymer for new circuit boards and reusing the remaining copper.

After a cleaning operation to remove the debris from the surface machining operation, the solder mask 26 is applied, generally by silk-screening, to the surface 36 of the base 12 as shown in the lower portion of FIG. 4B. The solder mask 26 is applied to the freshly cleaned surface of the board to keep contaniments off the surface 36 and to restrict solder, when it is later plated to the recesses 16, through-holes 14, and pad 20.

The solder mask 26 is not absolutely necessary, if better methods of solder control are available for inserting the components. Similarly, the recesses 16 are provided to provide an improved solder pool for improving the mechanical hold on components and are not absolutely essential to practice the present invention.

Referring now to FIGS. 5A through 5D, therein are shown the multiple manufacturing steps in a producton circuit board 11 of the present invention.

As previously described for the basic circuit board 10, the base 13 is formed with channels 19, through-holes 15, and the recesses 17. Generally, the channel 19 will be between 1 to 10 mils deep with a width as small as 2 mils and spaced apart by as little as 2 mils. The base 13 is then cleaned to remove the debris from the forming process and then clamped and baked to planarize and stress relieve the base 13.

Figure 5A:
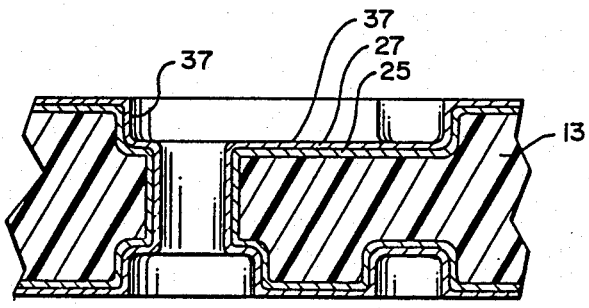
FIG. 5A is a cross-sectional view, out of scale, of the alternate embodiment during its manufacturing process.

As shown in FIG. 5a, the chromium plating 25 is next applied to a thickness of between $2 \times 10^{-4}$ to $15 \times 10^{-4}$ mil by sputtering on top and bottom which also allows a similar thickness in the through-holes 15 and recesses 17. While not absolutely required, the chromium bonds tightly to the base 13 and will also bond tightly to copper plated on it.

After the sputter plating with chromium, the copper plating 27 will be applied by sputtering, generally to a thickness of $5 \times 10^{-3}$ to $30 \times 10^{-3}$ mil thickness.

In the production circuit board 11, while not absolutely required, a layer of sacrificial material such as tin plating 37, may be chemically plated or sputtered onto the sputtered copper plating 27, generally to a thickness of $2 \times 10^{-4}$ to $15 \times 10^{-4}$ mil. This tin plating 37 prevents the copper from oxidizing and being contaminated when the circuit board 11 is removed from the vacuum of the sputtering chamber. As an alternative, the surface of the copper plating 27 could be later chemically etched or deoxidized to the uncontaminated copper.

It should be noted that this sacrificial material is totally removed and does not appear in the finished circuit board.

Figure 5B:
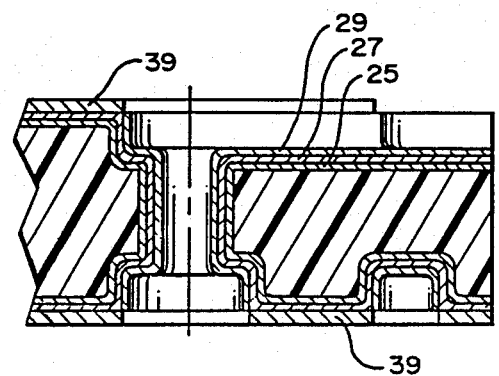
FIG. 5B is an enlarged, partial cross-sectional view, out of scale, of the alternate embodiment shown in FIG. 5A during another step.

The circuit board 11 is next coated with a chemically inactive material or plating resist 39 on all the high surfaces. This plating resist 39, as shown in FIG. 5B, may be applied by roller coating, which would mean that the plating resist 39 is automatically self-aligned to the hole and circuit configuration, or it may be silk-screened.

In the preferred embodiment, the plating resist 39 is a polyethyline plastic which is hot rolled and allowed to cool. This particular material was selected because in its cool state it will act as a dry lubricant for the surface machining process in addition to being immune to the effects of the etch and electrochemical plating solutions. However, many other materials may be used for the plating resist 44. In any event, it is desireable that the plating resist 39 be meltable for recycling.

After the plating resist 39 has been applied, the circuit board 11 is dipped in an etch bath to selectively etch away the sacrificial layer of tin plating 37 where the plaing resist 44 has not been applied to leave a clean, sputtered copper plating 27. There are no contaminents between the sputtered tin plating 37 and the sputtered copper plating 29 since both operations are performed sequentially in a vacuum.

While the circuit board 11 is still wet with from water cleaning to remove etch or deoxidant, it will be dipped in copper plating bath, generally electrochemical, to provide the copper plating 29 which may be built up to any desired thickness in the areas not covered by the resist 39. The thickness of copper is between 0.1 to 1.5 mils.

Figure 5C:
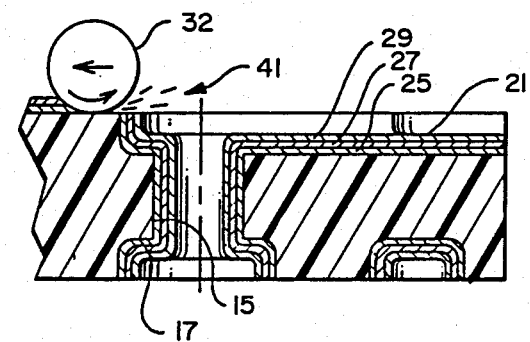
FIG. 5C is an enlarged, partial cross-sectional view, out of scale, of the alternate embodiment shown in FIG. 5A during another of its manufacturing steps.

After chemical copper plating, the circuit board 11 is surface machined, as for example by the grinding wheel 32, and this time, the particles 41 removed are of polymer, chromium, copper, and resist as shown in FIG. 5C. Again, this would be recyclable.

Figure 5D:
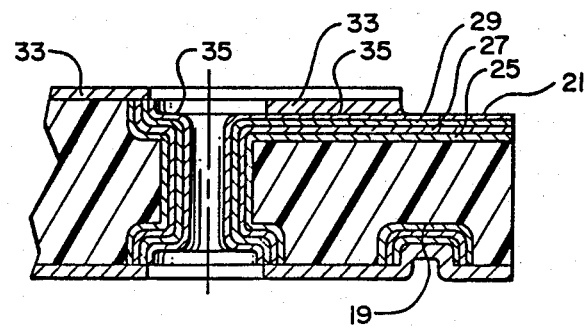
FIG. 5D is a cross-sectional view, out of scale, of the alternate embodiment during another manufacturing step shown in FIG. 5A.

After surface machining and cleaning, the solder mask 33 is applied, by silk-screening or an adhesive film, to form the layers as shown in FIG. 5D. The solder mask 33 provides insulation on top of the circuit lines 31 as well as over the virgin polymer to help completely insulate the conductors in different circuit lines.

After the solder mask 33 is in place, the circuit board 11 may be dipped into a hot tin dip to provide the bright tin plating 35 which is a fusable solder. With the hot dipping operation, hot air leveling will be used to remove the tin plating from those areas on the solder mask 23 where it is not desired. The tin plate thickness would be between 0.5 to 1.5 mils.

As shown in FIG. 5D, the channeled circuit board 11 is complete and ready for insertion of electrical components.

Figure 6:
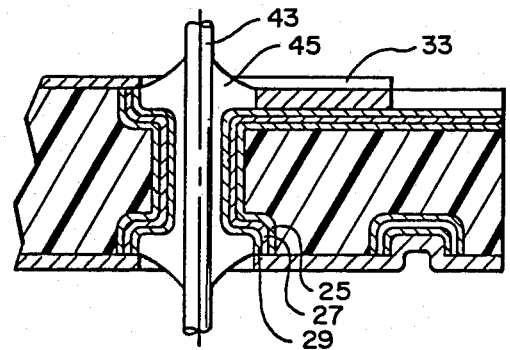
FIG. 6 is a cross-sectional view of a completed alternate embodiment.

Referring now to FIG. 6, therein as shown the channeled circuit board 11 having a component wire 43 held in place by further tin solder 45.

As would be evident to those skilled in the art, if other methods of securing components to a circuit board were developed, such as surface soldering without the need for through-holes, the basic circuit board would only require that the base material have a plurality of conductive material containing channels and the through-holes and recesses would no longer be required.

As would be also evident to those skilled in the art, the present invention is susceptable to multi-layering merely by laminating a number of the boards together using conventional laminating techniques. In addition, it would be possible to make multi-layered boards by the process of coating the boards with additional polymer material and building up additional layers by using conventional printed circuit board technology.

In accordance with one aspect of the invention, a circuit board is formed from a thermoplastic polymer substrate molded with at least one channel. A conductive material, such as copper, is sputtered to a uniform thin layer covering the channel and remaining non-channel portions. Thereafter, the conductive material layer on the non-channel portions is removed by surface machining down to the virgin polymer material.

In another aspect of the invention, the conductive material is sputtered directly onto the virgin polymer surface of the board substrate without prior chemical treatment of the substrate. During sputtering, the polymer substrate board is placed in a large demountable vacuum tube having a cathode made of the metal to be sputtered. The tube is operating under conditions that promote cathode bombardment by positive ions. As a result, extremely small particles of molten material fall uniformly on the object at high velocity to produce on it a thin, conductive metal coating.

The sputtering process preferably occurs in an argon atmosphere. To improve adhesion of the conductive material on the virgin polymer substrate, small quantities of oxygen are initially introduced into the argon atmosphere at the beginning of the sputtering process. This oxygen chemically reacts with the conductive material to partially oxide the conductive material to obtain an initial oxide layer on the virgin polymer substrate which improves adhesion. Preferably, the oxygen is only used at the beginning of the sputtering process.

In one embodiment of the invention, the oxygen is supplied at a partial pressure of approximately $20 \times 10^{-5}$ mm of mercury for about 1/10 of a second and concurrent with sputtering of the copper conductive material. Thereafter, the supply of oxygen terminates and pure copper is then sputtered onto the oxide layer for approximately 40 to 50 seconds to obtain a copper thickness of about 4 to 5 micrometers.

In accordance with a further aspect of the invention, the sputtered board is then subjected to heat treatment for approximately 12 to 25 minutes at a temperature of about 175°–225° C., and preferably 200° C. for 20 minutes. It has been discovered that the heat treatment significantly improves the adhesion of the sputtered copper film to the virgin polymer substrate surface.

The sputtering of conductive metal such as copper to coat the polymer substrate is a preferred form of vacuum deposition since the molten conductive metal particles bombard against the polymer substrate at high speed to uniformly adhere to the surface by compaction. The metal matrix of the sputtered material is substantially free of chemicals and is therefore substantially corrosion resistant in relation to plated conductive material.

Surface treatment methods for oxidizing the substrate surface may also include acid etching, oxygen plasma, etc.

It will be apparent to those skilled in the art that the present invention can be practiced on circuit boards in which circuit lines are formed on one or both sides of the circuit board and further in which the components are surface mounted on the board. Thus, the present invention applies to channeled circuit boards formed without through-holes and recesses.

As many possible embodiments and combinations may be made of the present invention without the parting from the scope thereof, it is to be understood that all matters set forth herein are shown in the accompanying drawings to be interpreted in an illustrative and not limiting sense.

I claim:

1. A circuit carrier made by the process of providing a nonconductive molded polymer substrate base with at least one channel in a surface thereof and sputtering a conductive film in said channel and onto a virgin polymer surface thereof to establish a circuit line in said channel.

2. The circuit carrier of claim 1, made by the additional process steps of forming the conductive film with an oxidized film formed directly on the virgin polymer surface of the substrate and sputtered conductive material formed directly on the oxidized film and heat treating the sputtered conductive film and nonconductive base.

3. The carrier of claim 1, wherein said nonconductive base has first and second surfaces, said first surface having said channel provided therein and said second surface having a second channel provided therein, and a through-hole connecting said first and second channels together, said sputtered conductive film disposed in said second channel and said first channel by disposing by sputtering conductive material all over said nonconductive base and removing said conductive material from non-channel areas of the first and second surfaces.

4. A circuit board made by the process of:
    planarizing and stress relieving a nonconductive polymer board having a channel provided thereon; and
    sputtering conductive metal in said channel and onto nonchannel areas of said nonconductive board and surface processing the nonchannel portion of said nonconductive board to a virgin polymer surface thereof to completely remove said conductive metal therefrom and leave said conductive metal in said channel.

5. The circuit board as claimed in claim 4, wherein said nonconductive board has first and second sides, said first side having said channel provided therein and said second side having a second channel provided therein; the channels being connected together by a through-hole, said conductive metal disposed in said second channel by convering said first and second sides of nonconductive board simultaneously with said conductive metal and removing said conductive metal from the non-channel portions at said first and second sides.

6. The circuit board as claimed in claim 4, including additional conductive metal covering said conductive metal by covering the nonchannel portion of said nonconductive board with an inactive material which said additional conductive metal will not cover, cleaning said nonconductive board, covering said nonconductive board with said additional conductive metal, and removing said additional conductive material from said inactive material.

7. The circuit carrier as claimed in claim 4 including additional conductive metal covering said conductive metal by covering said conductive metal with a sacrificial metal, covering the nonchannel portion of said nonconductive board with an inactive material which will not be removed when said sacrificial metal is removed and will not be covered by said additional conductive metal, removing said sacrificial metal, covering said conductive metal with said additional conductive metal, and removing said inactive material.

8. The circuit board as claimed in claim 4, including additional conductive metal chemically deposited on said conductive material by depositing sacrificial material on said conductive material, coating nondepression portions of said conductive metal with an inactive lubricant material, chemically removing said sacrificial metal from depression portions of said conductive metal not coated with said inactive lubricant material, and chemically depositing said additional conductive metal where said sacrificial metal has been removed.

9. The circuit carrier as claimed in claim 4, including:
    a reactive metal deposited to bond to said nonconductive board and to react to said conductive metal deposited thereon;
    additional conductive metal chemically deposited on said conductive metal by depositing a sacrificial metal on said conductive metal, coating nondepression portions of said conductive material with an inactive lubricant material, chemically removing said sacrificial metal from said depression portions of said conductive material not coated with said inactive material, and chemically depositing said additional conductive material where said sacrificial material has been removed;
    an inert material deposited on said nonconductive board and said additional conductive metal except in preselected areas by dry surface machining said circuit carrier to remove all of the said nonchannel portions of said conductive metal using said inactive lubricant material as a dry lubricant and selectively depositing said inert material; and
    a solderable material deposited on said preselected areas.

10. The circuit board as claimed in claim 4, wherein said conductive metal and a portion of said nonconductive board around said channels are removed by coating nonchannel portions of said conductive metal with a dry lubricant material and surface machining said circuit board to remove all of said dry lubricant, nondepression portions of said conductive metal, and the surface portions of said nonconductive board.

11. The circuit board as claimed in claim 4, including:
    a reactive material deposited on said nonconductive board prior to depositing said conductive metal;
    additional conductive metal chemically deposited on said conductive metal by coating the nonchannel portion of said conductive metal with an inactive dry lubricant material on which said additiional conductive metal will not chemically deposit depositing said additional conductive metal on the channel portion, and surface machining said circuit carrier using said dry lubricant material to aid in removing all of said nonchannel portions of said conductive metal;
    a solder repellent material deposited on said nonconductive board and said additional conductive metal except in a preselected area; and
    a solderable metal deposited on said circuit board and being removed from said solder repellent material to deposit only on said preselected area.

12. The circuit board as claimed in claim 4, wherein said nonconductive board is planarized by being compressed between two parallel surfaces and stress relieved by heating prior to the deposition of said conductive metal.

13. The circuit board as claimed in claim 4 including an additional nonconductive board having conductive metal covered channels provided therein bonded to said nonconductive board.

14. The circuit board of claim 1, made by the further process of molding the polymer substrate with a plurality of circuit line channels molded into one surface thereof; sputtering all areas of said polymer base with conductive materials; and surface machining said one surface of said circuit board to remove all said conductive material excepting said circuit line channels.

* * * * *